US009390923B2

(12) United States Patent
Yoo et al.

(10) Patent No.: US 9,390,923 B2
(45) Date of Patent: Jul. 12, 2016

(54) METHODS OF REMOVING RESIDUAL POLYMERS FORMED DURING A BORON-DOPED AMORPHOUS CARBON LAYER ETCH PROCESS

(71) Applicant: APPLIED MATERIALS, INC., Santa Clara, CA (US)

(72) Inventors: Jeong Hyun Yoo, Gyeonggi-do (KR); Hoon Sang Lee, Byoungjeom Dong (KR); Byungkook Kong, San Ramon, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/324,000

(22) Filed: Jul. 3, 2014

(65) Prior Publication Data

US 2016/0005602 A1    Jan. 7, 2016

(51) Int. Cl.
*H01L 21/302* (2006.01)
*H01L 21/033* (2006.01)
*H01L 21/3065* (2006.01)
*H01L 21/32* (2006.01)

(52) U.S. Cl.
CPC ........ *H01L 21/0338* (2013.01); *H01L 21/3065* (2013.01); *H01L 21/32* (2013.01)

(58) Field of Classification Search
CPC ...................... H01L 21/3065; H01L 21/30621; H01L 21/32136; H01L 21/3081; H01L 21/31058; H01L 21/0338; H01L 21/31114; H01L 21/32; H01L 21/32139; H01L 21/308; H01J 37/321; H01J 2237/32

USPC ......... 438/706, 710, 712, 714, 720, 719, 723, 438/725; 216/41, 72, 81
See application file for complete search history.

(56) References Cited

U.S. PATENT DOCUMENTS

| 6,281,135 B1 * | 8/2001 | Han et al. .................. 438/725 |
| 6,939,794 B2 | 9/2005 | Yin et al. |
| 2009/0035944 A1 * | 2/2009 | Chiang et al. ............... 438/703 |
| 2009/0212010 A1 * | 8/2009 | Wang et al. .................. 216/47 |
| 2012/0285481 A1 | 11/2012 | Lee et al. |
| 2013/0109188 A1 * | 5/2013 | Kim et al. .................... 438/710 |
| 2014/0285492 A1 | 9/2014 | Asente |

FOREIGN PATENT DOCUMENTS

| EP | 1 321 977 | 6/2003 |
| WO | WO 2004/053978 | 6/2004 |

\* cited by examiner

*Primary Examiner* — Lan Vinh
(74) *Attorney, Agent, or Firm* — Moser Taboada; Alan Taboada

(57) ABSTRACT

Methods for removing residual polymers formed during etching of a boron-doped amorphous carbon layer are provided herein. In some embodiments, a method of etching a feature in a substrate includes: exposing a boron doped amorphous carbon layer disposed on the substrate to a first plasma through a patterned mask layer to etch a feature into the boron doped amorphous carbon layer, wherein the first plasma is formed from a first process gas that reacts with the boron doped amorphous carbon layer to form residual polymers proximate a bottom of the feature; and exposing the residual polymers to a second plasma through the patterned mask layer to etch the residual polymers proximate the bottom of the feature, wherein the second plasma is formed from a second process gas comprising nitrogen ($N_2$), oxygen ($O_2$), hydrogen ($H_2$), and methane ($CH_4$).

20 Claims, 3 Drawing Sheets

METHODS OF REMOVING RESIDUAL POLYMERS FORMED DURING A BORON-DOPED AMORPHOUS CARBON LAYER ETCH PROCESS

FIELD

Embodiments of the present disclosure generally relate to semiconductor substrate processing, and more specifically, to methods of removing residual polymers formed during etching of a boron-doped amorphous carbon layer.

BACKGROUND

As the critical dimension of device features decreases, the thickness of an amorphous carbon mask layer must be increased in order to allow the mask layer to endure while etching underlying layers. However, the increased thickness of the amorphous carbon layer negatively impacts wafer translucence. In order to overcome increasingly thick amorphous carbon mask layers, a boron doped amorphous carbon mask layer is used.

A boron-doped amorphous carbon layer is not photosensitive and is instead patterned with a plasma etch to accurately reproduce a pattern of an overlying photosensitive layer. The greater plasma etch resistance of boron-doped carbon layers is such that a fluorocarbon species such as $C_xF_y$ or $C_xH_yF_z$ species and high RF bias power, is required to etch the boron-doped amorphous carbon layer. However, the inventors have observed that this etch process results in the formation of residual polymers (i.e. fluorocarbon residues) proximate the bottom of the features patterned into the boron doped carbon layers, thereby making it difficult to obtain a vertical profile in the feature.

Thus, the inventors have provided improved methods for removing residual polymers formed during etching of a boron-doped amorphous carbon layer.

SUMMARY

Methods for removing residual polymers formed during etching of a boron-doped amorphous carbon layer are provided herein. In some embodiments, a method of etching a feature in a substrate, may include: exposing a boron doped amorphous carbon layer disposed on the substrate to a first plasma through a patterned mask layer to etch a feature into the boron doped amorphous carbon layer, wherein the first plasma is formed from a first process gas that reacts with the boron doped amorphous carbon layer to form residual polymers proximate a bottom of the feature; and exposing the residual polymers to a second plasma through the patterned mask layer to etch the residual polymers proximate the bottom of the feature, wherein the second plasma is formed from a second process gas comprising nitrogen ($N_2$), oxygen ($O_2$), hydrogen ($H_2$), and methane ($CH_4$).

In some embodiments, a method of processing a substrate, may include depositing a boron doped amorphous carbon layer disposed atop a substrate; depositing a patterned photoresist layer atop the boron doped amorphous carbon layer; exposing the substrate to a first plasma formed from a first process gas to etch a feature into the boron doped amorphous carbon layer, wherein the first process gas reacts with the boron doped amorphous carbon layer to form residual polymers proximate a bottom of the feature; applying a first bias power to the substrate while exposing the substrate to the first plasma; exposing the substrate to a second plasma formed from a second process gas comprising nitrogen ($N_2$), oxygen ($O_2$), hydrogen ($H_2$), and methane ($CH_4$) to etch the residual polymers proximate the bottom of the feature; and applying a second bias power to the substrate while exposing the substrate to the second plasma.

In some embodiments, a method of etching a feature in a substrate includes: exposing a boron doped amorphous carbon layer disposed on the substrate to a first plasma through a patterned mask layer to etch a feature into the boron doped amorphous carbon layer, wherein the first plasma is formed from a first process gas that reacts with the boron doped amorphous carbon layer to form residual polymers proximate a bottom of the feature; and exposing the residual polymers through the patterned mask layer to hydroxylamine ($NH_2OH$) formed by a second plasma to etch the residual polymers proximate the bottom of the feature.

Other embodiments and variations of the present disclosure are discussed below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
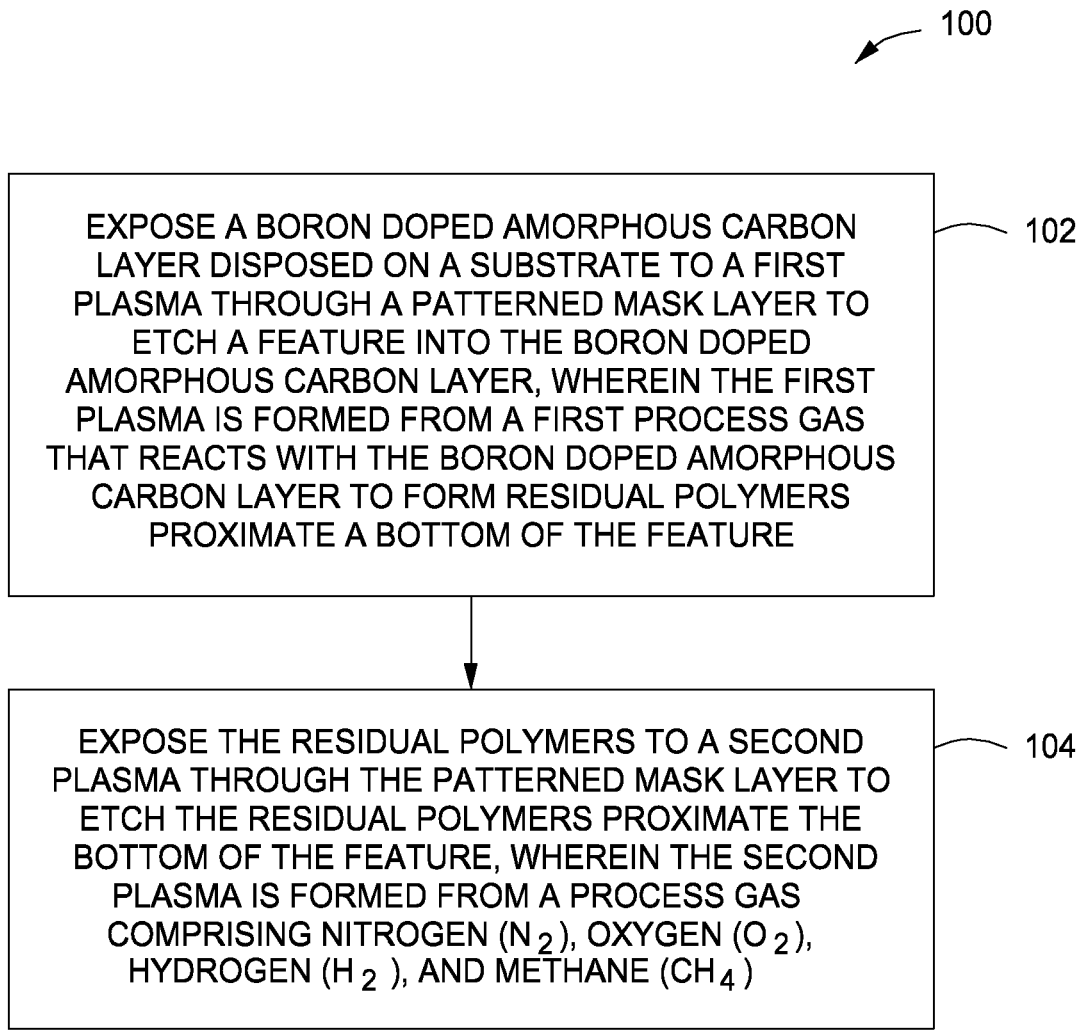
FIG. 1 is a flow diagram of a method for etching a feature in a substrate in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure provide methods for removing residual polymers formed during etching of a boron-doped amorphous carbon layer. Embodiments of the inventive process described herein advantageously improve the structure of features etched into a boron-doped amorphous carbon layer. Specifically, the method described herein improves the verticality of the sidewalls of the features etching into the boron doped amorphous carbon layer. Without limitation of the scope of the present disclosure, embodiments of the inventive processes disclosed herein can be advantageously used for mask opening processes of DRAM, flash memory, and logic device fabrication.

FIG. 1 is a flow diagram of a method 100 for processing a substrate in accordance with some embodiments of the present disclosure. FIGS. 2A-2D are illustrative cross-sectional views of a substrate during different stages of the processing sequence of FIG. 1 in accordance with some embodiments of the present disclosure.

Figure 2A:
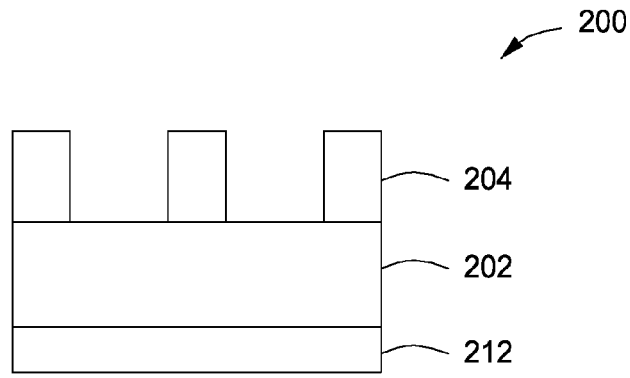
FIGS. 2A-2D are illustrative cross-sectional views of a substrate during different stages of the method of FIG. 1 in accordance with some embodiments of the present disclosure.

A substrate 200, as depicted in FIG. 2A, comprises a boron doped amorphous carbon layer 202. The substrate 200 may be any suitable substrate, such as a doped or un-doped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer.

In some embodiments, the boron doped amorphous carbon layer 202 may be formed by a chemical vapor deposition (CVD) process, such as a thermal CVD process or plasma enhanced CVD (PECVD) process. For example, a boron doped amorphous carbon layer 202 may be formed with a PECVD process using hydrocarbon precursors, such as, but not limited to, methane ($CH_4$), propylene ($C_3H_6$), propyne ($C_3H_4$), propane ($C_3H_8$), butane ($C_4H_{10}$), butylenes ($C_4H_8$), butadiene ($C_4H_6$), acetylene ($C_2H_2$), toluene ($C_7H_8$ ($C_6H_5CH_3$)) and mixtures thereof with a boron source, such as, but not limited to diborane ($B_2H_6$). The boron doped amorphous carbon layer 202 may also include nitrogen or other additives.

In some embodiments, the substrate 200 may further comprise one or more target layers 212 underlying the boron doped amorphous carbon layer 202. In some embodiments, the target layers 212 may have a plurality of layers comprising any materials suitable to fabricate a desired device. For example, in some embodiments, the plurality of layers may include one or more oxide layers, such as silicon oxide ($SiO_2$), one or more nitride layers, such as silicon nitride (SiN), combinations thereof, or the like. In some embodiments, the plurality of layers may comprise, for example, alternating oxide layers and nitride layers that repeat any number of times necessary to form a gate stack having a desired thickness. Each of the layers may have any thickness suitable to facilitate fabricating a desired device. In some embodiments, the layers may all have the same thickness, or in some embodiments, the layers may have varying thicknesses.

The substrate 200 further comprises a patterned mask layer 204 disposed atop the boron doped amorphous carbon layer 202. The patterned mask layer 204 may be any suitable mask layer such as a hard mask or photoresist layer. For example, in embodiments where the patterned mask layer 204 is a hard mask, the patterned mask layer 204 may comprise at least one of oxides, such as silicon dioxide ($SiO_2$), silicon oxynitride (SiON), or the like, or nitrides, such as titanium nitride (TiN), silicon nitride (SiN), or the like, silicides, such as titanium silicide (TiSi), nickel silicide (NiSi) or the like, or silicates, such as aluminum silicate (AlSiO), zirconium silicate (ZrSiO), hafnium silicate (HfSiO), or the like. The patterned mask layer 204 may be formed by any process suitable to form a patterned mask layer 204 capable of providing an adequate template for defining a pattern in the underlying boron doped amorphous carbon layer 202. For example, in some embodiments, the patterned mask layer 204 may be formed via a patterned etch process. In some embodiments, for example where the patterned mask layer 204 will be utilized to define advanced or very small node devices (e.g., about 40 nm or smaller nodes, such as used for Flash memory devices), the patterned mask layer 204 may be formed via a spacer mask patterning technique, such as a self-aligned double patterning process (SADP).

Figure 2B:
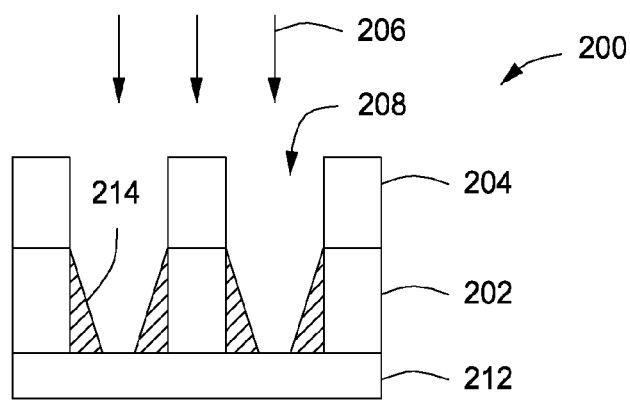

The method 100 generally begins at 102, as depicted in FIG. 2B, where the boron doped amorphous carbon layer 202 is exposed to a first plasma 206 through the patterned mask layer 204 to etch a feature 208 into the boron doped amorphous carbon layer 202. In some embodiments, the feature 208 is etched to a depth of about 50 to about 2000 nm. In some embodiments, the feature 208 is exposed to the first plasma for about 10 to about 1500 seconds. In some embodiments, the feature 208 has an aspect ratio of depth to width of the feature of, for example about 4:1 to about 30:1.

The first plasma 206 is formed from a first process gas comprising a gas or a mixture of gases suitable for etching a feature in the boron doped amorphous carbon layer 202. In some embodiments, the first process gas comprises a fluorine-containing gas. In some embodiments, the first process gas includes a fluorine containing gas, such as tetrafluoromethane ($CF_4$), hexafluoroethane ($C_2F_6$), fluoromethane ($CH_3F$), difluoromethane ($CH_2F_2$), methyl trifluoride ($CHF_3$), hexafluorobutadiene ($C_4F_6$), and octafluorocyclobutane ($C_4F_8$) or the like. In some embodiments, the fluorine-containing gas may be provided at a flow rate of up to about 1000 sccm.

In some embodiments, the first process gas includes a chlorine-containing gas, such as chlorine ($Cl_2$) gas, hydrogen chloride (HCl), silicon tetrachloride ($SiCl_4$), or the like. In some embodiments, the chlorine-containing gas may be provided at a flow rate of up to about 1000 sccm.

In some embodiments, the first process gas may further include an oxygen-containing gas, such as oxygen ($O_2$) gas, carbon monoxide (CO), carbonyl sulfide (COS), sulfur dioxide ($SO_2$) or the like. In some embodiments, the oxygen-containing gas may be provided at a flow rate of up to about 1000 sccm.

In some embodiments, the first process gas further comprises an inert gas, such as one of argon, helium, xenon, or the like, or a combination thereof. In some embodiments, the first process gas may be provided to the process chamber at any suitable flow rate to form the first plasma 206. For example, in some embodiments, the first process gas may be provided at a total flow rate of about 30 sccm to about 3000 sccm. In some embodiments, a ratio of the flow rate of the fluorine-containing gas (or the chlorine-containing gas) to the flow rate of the inert gas is about 0 to about 50.

In some embodiments, the first plasma 206 may be formed by coupling RF source power at a suitable frequency to the first process gas within a suitable process chamber, such as described below with respect to FIG. 3, under suitable conditions to establish and maintain the plasma. For example, in some embodiments, about 100 watts to about 5,000 watts of RF energy at a frequency in a range from about 2 to about 162 MHz, having continuous wave or pulsing capabilities, may be provided to the process chamber to ignite and maintain the plasma. In some embodiments, the source power may be pulsed during the etching cycle. To pulse the source power, the radio frequency power is switched on and off during the etching cycle. In some embodiments, the switching of the power on and off is uniformly distributed in time throughout the etching cycle. In some embodiments, the timing profile of the pulsing may be varied throughout the etching cycle, and may depend on the composition of the substrate. The percentage of time the source power is switched on, i.e. the duty cycle as described above, is directly related to the pulsing frequency. In some embodiments, when the pulsing frequency ranges from about 10 Hz to about 10,000 Hz, the duty cycle ranges from about 10% to about 95%. The source power frequency and the pulsing frequency may be adjusted depending on the substrate material being processed.

In some embodiments, about 15 watts to about 3,000 watts of a bias power may be provided, for example, an RF bias power at a frequency of about 2 to about 13.56 MHz may be provided to the substrate via a substrate support. The bias power may be pulsed during the etching cycle. To pulse the bias power, the radio frequency power is switched on and off during the etching cycle. In some embodiments, the switching of the power on and off is uniformly distributed in time throughout the etching cycle. In some embodiments, the timing profile of the pulsing may be varied throughout the etching cycle, and may depend on the composition of the substrate. The percentage of time the bias power is switched on, i.e. the duty cycle as described above, is directly related to the pulsing frequency. In some embodiments, when the pulsing frequency ranges from about 10 Hz to about 10,000 Hz, the duty cycle ranges from about 10% to about 95%. The bias power frequency and the pulsing frequency may be adjusted depending on the substrate material being processed.

In some embodiments, the process chamber may be maintained at a pressure of about 2 mTorr to about 1,000 mTorr. In some embodiments, the process chamber may be maintained at a temperature of about −30 degrees Celsius to about 300 degrees Celsius during etching. The inventors have observed that etching the amorphous carbon layer 202 as described above results in the formation of residual polymer 214 proximate a bottom of the feature 208. The formation of the residual polymer 214 formation creates a non-vertical profile proximate the bottom of the feature 208 which will negatively impact subsequent etching and formation of features in the underlying target layer 212. The residual polymers formed from etching the boron doped amorphous carbon layer 202 may be a fluorocarbon compound having the formula $CF_x$.

Figure 2C:
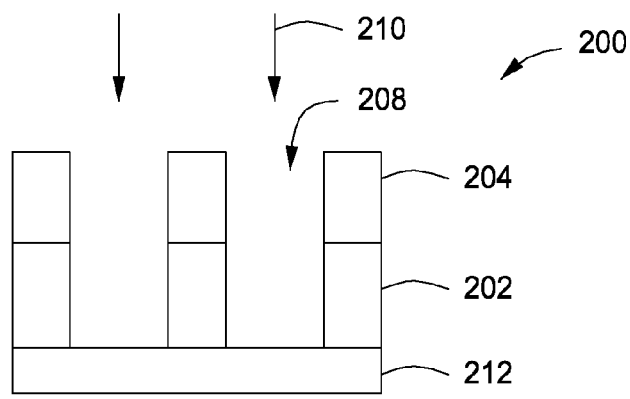

Next, at 104, and as depicted in FIG. 2C, the residual polymer 214 is exposed to a second plasma 210 through the patterned photoresist layer to etch the residual polymers 214 proximate the bottom of the feature 208. In some embodiments, the second plasma 210 is formed from any suitable process gas used to etch the residual polymers 214 with appropriate selectivity against surrounding layers that are not to be etched. For example, in some embodiments, the second plasma 210 is formed from a second process gas. The second process gas may be a mixture of gases. In some embodiments, the second process gas may comprise a mixture of oxygen ($O_2$), hydrogen ($H_2$), nitrogen ($N_2$) and methane ($CH_4$). In some embodiments, the second process gas further comprises an inert gas such as argon, helium, or the like. In some embodiments, the second process gas consists of oxygen, hydrogen, nitrogen gas, and carbon and optionally, the inert gas (e.g., the second process gas may include a plurality of gases that as a whole only include oxygen, hydrogen, nitrogen gas, and carbon and optionally, the inert gas). In some embodiments, the second process gas may be provided to the process chamber at any suitable flow rate to form the second plasma 210. For example, in some embodiments, the second process gas may be provided at a flow rate of about 50 sccm to about 5,000 sccm. In some embodiments, the oxygen ($O_2$) gas may be provided at a flow rate of about 0 sccm to about 1,000 sccm. In some embodiments, the hydrogen ($H_2$) gas may be provided at a flow rate of about 0 sccm to about 1,000 sccm. In some embodiments, the nitrogen ($N_2$) gas may be provided at a flow rate of about 0 sccm to about 1,000 sccm. In some embodiments, the methane ($CH_4$) gas may be provided at a flow rate of about 0 sccm to about 1,000 sccm. In some embodiments, the inert gas may be provided at a flow rate of about 0 sccm to about 1,000 sccm.

In some embodiments, the second plasma 210 may be formed by coupling RF source power at a suitable frequency to the second process gas within a suitable process chamber, such as described below with respect to FIG. 3, under suitable conditions to establish and maintain the second plasma. For example, in some embodiments, about 100 watts to about 5,000 watts of RF energy at a frequency in a range from about 2 to about 162 MHz, having continuous wave or pulsing capabilities, may be provided to the process chamber to ignite and maintain the second plasma. In some embodiments, the source power may be pulsed during the removal of the residual polymers. To pulse the source power, the radio frequency power is switched on and off during the removal of the residual polymers. In some embodiments, the switching of the power on and off is uniformly distributed in time throughout the removal of the residual polymers. In some embodiments, the timing profile of the pulsing may be varied throughout the etching cycle, and may depend on the composition of the substrate. The percentage of time the source power is switched on, i.e. the duty cycle as described above, is directly related to the pulsing frequency. In some embodiments, when the pulsing frequency ranges from about 10 Hz to about 10,000 Hz, the duty cycle ranges from about 10% to about 95%. The source power frequency and the pulsing frequency may be adjusted depending on the substrate material being processed.

In some embodiments, about 15 watts to about 3,000 watts of a bias power may be provided, for example, an RF bias power at a frequency of about 2 to about 162 MHz may be provided to the substrate via a substrate support. The bias power may be pulsed during the removal of the residual polymers. To pulse the bias power, the radio frequency power is switched on and off during the removal of the residual polymers. In some embodiments, the switching of the power on and off is uniformly distributed in time throughout removal of the residual polymers. In some embodiments, the timing profile of the pulsing may be varied throughout the removal of the residual polymers, and may depend on the composition of the substrate. The percentage of time the bias power is switched on, i.e. the duty cycle as described above, is directly related to the pulsing frequency. In some embodiments, when the pulsing frequency ranges from about 10 Hz to about 10,000 Hz, the duty cycle ranges from about 10% to about 95%. The bias power frequency and the pulsing frequency may be adjusted depending on the substrate material being processed.

In some embodiments, the process chamber may be maintained at a pressure of about 3 mTorr to about 1,000 mTorr. In some embodiments, the process chamber may be maintained at a temperature of about 0 degrees Celsius to about 300 degrees Celsius during removal of the residual polymers.

Not wishing to be bound by theory, it is believed that plasma of the second process gas produces hydroxylamine ($NH_2OH$), which reacts with the residual polymer 214 to form byproducts, such as carbon, nitrogen, oxygen, and hydrogen, which can be evacuated from the processing chamber. Thus, in some embodiments, at 104, the residual polymers are exposed through the patterned mask layer to hydroxylamine ($NH_2OH$) formed by the second plasma to etch the residual polymers proximate the bottom of the feature.

In some embodiments, to facilitate the directing of ions towards the substrate 202 a bias power may be provided to the substrate 200 via a substrate support disposed in a process chamber, for example, such as discussed below with respect to FIG. 3. Application of a bias power to the substrate advantageously allows for the control over etch directionality, for example to direct ions toward only the surface and bottom of a feature.

Figure 2D:
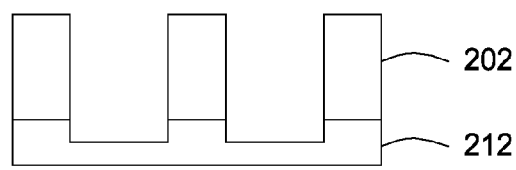

In some embodiments, once the residual polymer 214 is removed the method 100 generally ends and the substrate 200 may continue to be processed as desired. For example, as depicted in FIG. 2D, the one or more target layers 212 underlying the boron doped amorphous carbon layer 202 may undergo any suitable etch process to etch therein the pattern of the overlying boron doped amorphous carbon layer 202. Additionally, an ash or stripping process can be used to remove the remainder of the patterned mask layer 204 and/or boron doped amorphous carbon layer 202 after etching the one or more target layers 212.

The processes described herein may be performed in an integrated etch processing system (e.g., a cluster tool) that includes a vacuum transfer chamber having processing chambers coupled thereto that are suitable for etching materials present in the substrate, such as silicon and, optionally, metal, polysilicon, and high-k material layers present in, for example, a gate film stack. The processes described herein may also be performed in other integrated etch processing systems.

Figure 3:
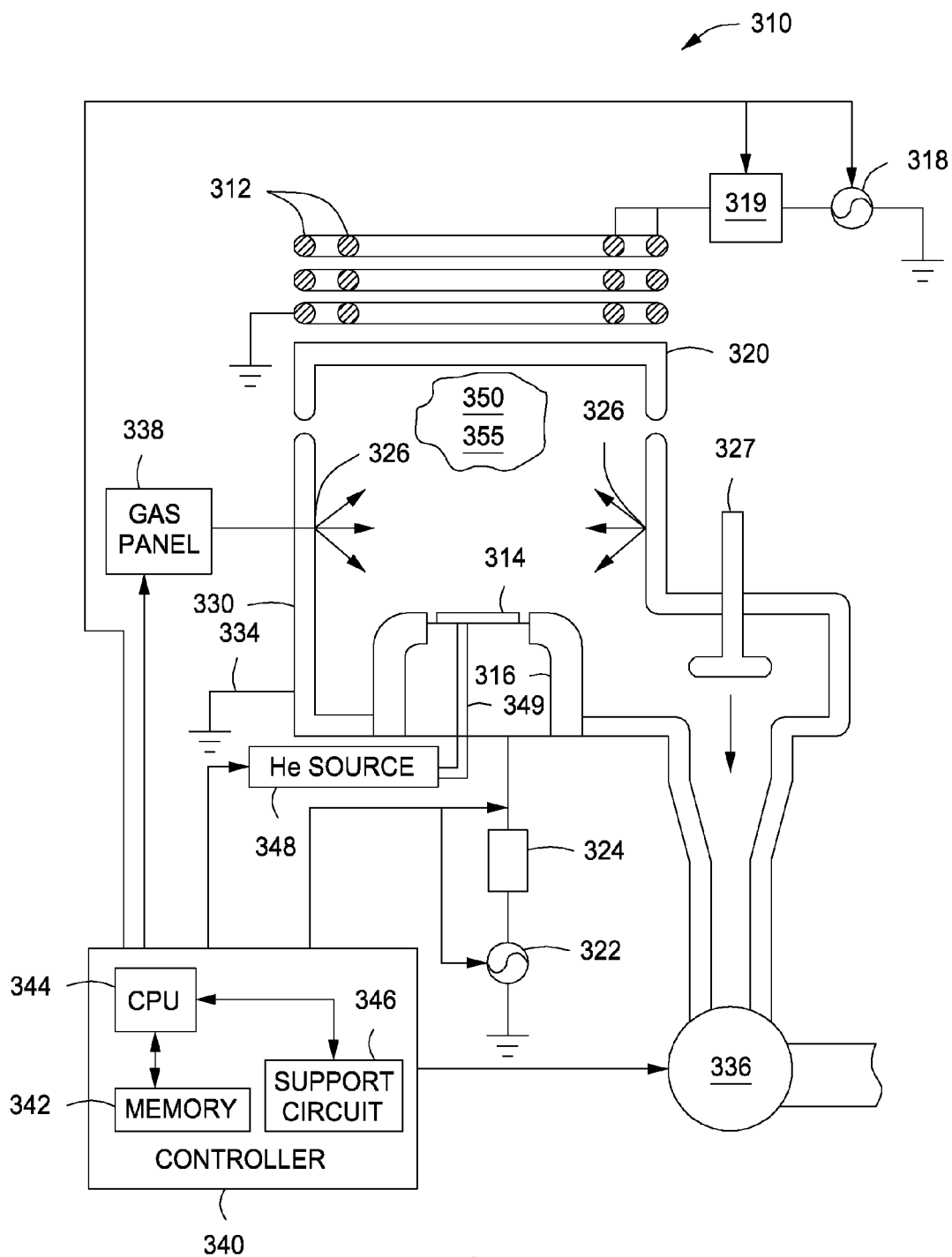
FIG. 3 depicts an etch reactor suitable for performing portions of the present disclosure.

For example, FIG. 3 depicts a schematic diagram of an illustrative etch reactor 300 of the kind that may be used to practice embodiments of the disclosure as discussed herein. The etch reactor 300 may be utilized alone or, more typically, as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors 300 include the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, also available from Applied Materials, Inc. Other etch reactors and/or cluster tools may suitably be used as well.

The etch reactor 300 comprises a chamber 310 having a substrate support (cathode) 316 within a conductive body (wall 330), and a controller 340. The chamber 310 may be supplied with a substantially flat dielectric ceiling 320. Alternatively, the chamber 310 may have other types of ceilings, e.g., a dome-shaped ceiling. An antenna comprising at least one inductive coil element 312 is disposed above the ceiling 320 (two co-axial inductive coil elements 312 are shown). The inductive coil element 312 is coupled to a plasma power source 318 through a first matching network 319. The plasma power source 318 (e.g., an RF power source) typically is capable of producing up to 3000 W at a tunable frequency in a range from 50 KHz to 13.56 MHz. The plasma power source 318 may be operable in a continuous wave (CW) or pulsed mode. When in pulse mode, the plasma power source 318 may be pulsed at a pulse frequency of up to about 100 KHz, or in some embodiments, between about 100 Hz to about 100 KHz. The plasma power source 318 may be operated at a duty cycle (e.g., the percentage of on time during the total of on time and off time in a given cycle) of between about 10% and about 90%.

The substrate support 316 is coupled, through a second matching network 324, to a biasing power source 322. The biasing power source 322 generally is capable of producing up to 1500 W at a frequency of approximately 13.56 MHz. The biasing power may be either continuous or pulsed power. In other embodiments, the biasing power source 322 may be a DC or pulsed DC source. The biasing power source 322 may be operable in a continuous wave (CW) or pulsed mode. When in pulse mode, the biasing power source 322 may be pulsed at a pulse frequency of up to about 100 kHz, or in some embodiments, between about 100 Hz to about 100 KHz. The biasing power source 322 may be operated at a duty cycle (e.g., the percentage of on time during the total of on time and off time in a given cycle) of between about 10% and about 90%.

A controller 340 comprises a central processing unit (CPU) 344, a memory 342, and support circuits 346 for the CPU 344 and facilitates control of the components of the chamber 310 and, as such, of the etch process, as discussed below in further detail.

In operation, a substrate 314 is placed on the substrate support 316 and process gases are supplied from a gas panel 338 through entry ports 326 and form a gaseous mixture 350. The gaseous mixture 350 is ignited into a plasma 355 in the chamber 310 by applying power from the plasma power source 318 and biasing power source 322 to the inductive coil element 312 and the cathode (substrate support 316), respectively. The pressure within the interior of the chamber 310 is controlled using a throttle valve 327 and a vacuum pump 336. Typically, the wall 330 is coupled to an electrical ground 334. The temperature of the wall 330 is controlled using liquid-containing conduits (not shown) that run through the wall 330.

The temperature of the substrate 314 is controlled by stabilizing a temperature of the substrate support 316. In one embodiment, the helium gas from a gas source 348 is provided via a gas conduit 349 to channels (not shown) formed in the pedestal surface under the substrate 314. The helium gas is used to facilitate heat transfer between the substrate support 316 and the substrate 314. During processing, the substrate support 316 may be heated by a resistive heater (not shown) within the pedestal to a steady state temperature and then the helium gas facilitates uniform heating of the substrate 314. Using such thermal control, the substrate 314 may be maintained at a temperature of between about 0-650 degrees Celsius.

Other etch chambers may be used to practice the disclosure, including chambers with remote plasma sources, electron cyclotron resonance (ECR) plasma chambers, and the like.

To facilitate control of the process chamber 310 as described above, the controller 340 may be one of any form of general-purpose computer processor that can be used in an industrial setting for controlling various chambers and sub-processors. The memory 342, or computer-readable medium, of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method described herein is generally stored in the memory 342 as a software routine. The software routine may also be stored and/or executed by a second CPU (not shown) that is remotely located from the hardware being controlled by the CPU 344.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

While the foregoing is directed to embodiments of the present disclosure, other and further embodiments of the disclosure may be devised without departing from the basic scope thereof.

The invention claimed is:

1. A method of etching a feature in a substrate, comprising:
 exposing a boron doped amorphous carbon layer disposed on the substrate to a first plasma through a patterned mask layer to etch a feature into the boron doped amorphous carbon layer, wherein the first plasma is formed from a first process gas that reacts with the boron doped amorphous carbon layer to form residual polymers proximate a bottom of the feature; and exposing the residual polymers to a second plasma through the patterned mask layer to etch the residual polymers proximate the bottom of the feature, wherein the second plasma is formed from a second process gas consisting of nitrogen ($N_2$), oxygen ($O_2$), hydrogen ($H_2$), and methane ($CH_4$).

2. The method of claim 1, wherein the first process gas comprises one of a fluorine-containing gas or a chlorine-containing gas.

3. The method of claim 1, wherein the second plasma forms hydroxylamine ($NH_2OH$) to react with the residual polymers proximate the bottom of the feature.

4. The method of claim 1, further comprising forming the first plasma by igniting the first process gas using an RF power source.

5. The method of claim 4, wherein the RF power source provides power at about 100 to about 5,000 watts.

6. The method of claim 1, wherein the residual polymers comprise a fluorocarbon compound having a formula $CF_x$.

7. The method of claim 1, further comprising forming the second plasma by igniting the second process gas using an RF power source.

8. The method of claim 7, wherein the RF power source provides power at about 100 to about 5,000 watts.

9. The method of claim 1, further comprising applying a first bias power to the substrate while exposing the substrate to the first plasma.

10. The method of claim 9, wherein the first bias power is about 15 to about 3,000 watts.

11. The method of claim 1, further comprising applying a second bias power to substrate while exposing the substrate to the second plasma.

12. The method of claim 11, wherein the second bias power is about 15 to about 3,000 watts.

13. The method of claim 1, wherein the feature has an aspect ratio of depth to width of greater than about 10:1.

14. A method of processing a substrate, comprising:
depositing a boron doped amorphous carbon layer disposed atop a substrate;
depositing a patterned photoresist layer atop the boron doped amorphous carbon layer;

exposing the boron doped amorphous carbon layer to a first plasma formed from a first process gas comprising one of a fluorine containing gas or a chlorine containing gas to etch a feature into the boron doped amorphous carbon layer, wherein the first process gas reacts with the boron doped amorphous carbon layer to form residual polymers proximate a bottom of the feature; and exposing the substrate to a second plasma formed from a second process gas comprising nitrogen (N2), oxygen (O2), hydrogen (H2), and methane (CH4) to etch the residual polymers proximate the bottom of the feature without etching the boron doped amorphous carbon layer.

15. The method of claim 14, further comprising applying a first bias power to the substrate while exposing the substrate to the first plasma; and applying a second bias power to the substrate while exposing the substrate to the second plasma.

16. The method of claim 14, further comprising forming the first plasma by igniting the first process gas using an RF power source at about 100 to about 5,000 watts.

17. The method of claim 14, further comprising forming the second plasma by igniting the second process gas using an RF power source at about 100 to about 5,000 watts.

18. A method of etching a feature in a substrate, comprising:
exposing a boron doped amorphous carbon layer disposed on the substrate to a first plasma through a patterned mask layer to etch a feature into the boron doped amorphous carbon layer, wherein the first plasma is formed from a first process gas that reacts with the boron doped amorphous carbon layer to form residual polymers proximate a bottom of the feature; and exposing the residual polymers through the patterned mask layer to hydroxylamine ($NH_2OH$) formed by a second plasma to etch the residual polymers proximate the bottom of the feature.

19. The method of claim 18, wherein the second plasma is formed from a second process gas consisting of nitrogen ($N_2$), oxygen ($O_2$), hydrogen ($H_2$), and methane ($CH_4$) and, optionally, an inert gas.

20. The method of claim 19, wherein the second process gas includes the inert gas.

* * * * *